United States Patent
Chen

(10) Patent No.: US 9,484,493 B2
(45) Date of Patent: Nov. 1, 2016

(54) RECTIFYING UNIT, A LIGHT EMITTING DIODE DEVICE, AND THE COMBINATION THEREOF

(75) Inventor: Chao-Hsing Chen, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 1308 days.

(21) Appl. No.: 13/280,929

(22) Filed: Oct. 25, 2011

(65) Prior Publication Data
US 2012/0097993 A1 Apr. 26, 2012

(30) Foreign Application Priority Data
Oct. 25, 2010 (TW) .............................. 99136441 A

(51) Int. Cl.
| H05B 37/00 | (2006.01) |
| H01L 33/08 | (2010.01) |
| H01L 33/38 | (2010.01) |
| H05B 33/08 | (2006.01) |

(52) U.S. Cl.
CPC .............. *H01L 33/08* (2013.01); *H01L 33/38* (2013.01); *H05B 33/0803* (2013.01)

(58) Field of Classification Search
CPC .... H01L 33/08; H01L 33/38; H05B 33/0803
USPC ................. 315/250, 192, 291–294
See application file for complete search history.

(56) References Cited

U.S. PATENT DOCUMENTS

| 2007/0131942 A1* | 6/2007 | Yen et al. ........................ 257/79 |
| 2008/0106212 A1* | 5/2008 | Yen et al. ...................... 315/192 |
| 2009/0322241 A1* | 12/2009 | Onushkin et al. ............ 315/250 |
| 2010/0308347 A1* | 12/2010 | Yeh et al. ........................ 257/88 |

FOREIGN PATENT DOCUMENTS

| CN | 101211957 A | 7/2008 |
| CN | 101860998 A | 10/2010 |
| TW | 201029145 A1 | 8/2010 |

* cited by examiner

*Primary Examiner* — Tuyet Vo
*Assistant Examiner* — Amy Yang
(74) *Attorney, Agent, or Firm* — Muncy, Geissler, Olds & Lowe, P.C.

(57) ABSTRACT

A light emitting diode device includes a substrate; a first conducting terminal and a second conducting terminal receiving the alternative current signal; a first and a third light-emitting diode groups disposed on the substrate including a plurality of light emitting diodes electrically connecting with the first conducting terminal and the second conducting terminal and emitting light during the positive half power cycle; a second and the third light-emitting diode groups disposed on the substrate including a plurality of light emitting diodes electrically connecting with the first conducting terminal and the second conducting terminal and emitting light during the negative half power cycle; wherein one light emitting diode in the first light-emitting diode group includes more than three conductive connecting points to electrically connect to the second light-emitting diode group and the third light-emitting diode group.

16 Claims, 4 Drawing Sheets

RECTIFYING UNIT, A LIGHT EMITTING DIODE DEVICE, AND THE COMBINATION THEREOF

TECHNICAL FIELD

The disclosure relates to a rectifying unit, a light emitting diode device, and the combination thereof, and more particularly to a rectifying unit, a light emitting diode device, and the combination thereof with high light emitting efficiency and high heat dissipation efficiency.

REFERENCE TO RELATED APPLICATION

This application claims the right of priority based on TW application Serial No. 099136441, filed on Oct. 25, 2010, and the content of which is hereby incorporated by reference in its entirety.

DESCRIPTION OF BACKGROUND ART

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future. However, the conventional LED has to be driven by the direct current (DC), and therefore a converter is needed between the conventional LED and the alternative current (AC). The converter has large volume and large weight which leads to cost raising and the wastage of power during the electricity conversion. Therefore, the cost of the conventional LED cannot compete with the present light source.

As the LED technology develops, a bridge-type alternative current light emitting diode structure which can emit light during both positive and negative wave signal-input time of the alternative current is provided. As shown in FIG. 1 and FIG. 2, it mainly takes the advantage of the Wheatstone Bridge and therefore the converter is no longer required. Besides, because the structures of the light emitting diode and the rectifying diode are similar, some manufacture steps can be merged in the same manufacturing step. The space of the rectifying part of the light emitting diode device and the manufacturing steps of the light emitting diode device can be saved and the light emitting efficiency of the light emitting diode device can be enhanced.

As shown in FIG. 1 and FIG. 2, FIG. 2 discloses a circuit design 100' of a bridge-type alternative current light emitting diode device and FIG. 1 discloses the structure of the light-emitting diode device 100 in accordance with the circuit design 100'. The light emitting diode device 100 includes a substrate 10, a rectifying unit 11 formed on the substrate 10, and a first conducting terminal 12 and a second conducting terminal 13 respectively receiving the external transmitting power signal. Wherein, the rectifying unit 11 includes a plurality of light-emitting diode groups 101, 102, and 103 arranged in accordance with the Wheatstone Bridge circuit arrangement between the first conducting terminal 12 and the second conducting terminal 13. While the alternative current signal is inputted from the external power source, in accordance with the design of the circuit, when the input signal is a positive half power cycle, the first light-emitting diode group 101 emits light; when the signal is a negative half power cycle, the second light-emitting diode group 102 emits light; and the third light-emitting diode group 103 disposed in the central portion of the Wheatstone Bridge circuit emits light during both positive and negative half power cycles.

In order to achieve higher light emitting efficiency of the light emitting diode device, in the arrangement of the device structure, the number of the light emitting diodes in the full-time emitting light-emitting diode group 103 (the third light-emitting diode group 103) is increased. However, in the aspect of the circuit design, no matter how many the light emitting diodes in the third light-emitting diode group 103 are, it is still necessary for the rectifying first light-emitting diode group 101 and the rectifying second light-emitting diode group 102 located at two sides of the light emitting diode device to be electrically connected to each other.

As shown in FIG. 3, when the number of the light emitting diodes in the third light-emitting diode group 103 in the central of the light emitting diode device 300 is increased, the light-emitting diode groups 101, 102, or 103 need to change their structures accordingly. In this situation, the shape of the light emitting diode becomes long and narrow and the light emitting area is reduced. Besides, because the connecting relationship between the light emitting diodes does not change, the modification of the device structure is limited.

SUMMARY OF THE DISCLOSURE

The present disclosure provides a light emitting diode device including a substrate; a first conducting terminal and a second conducting terminal receiving the alternative current signal; a first light-emitting diode group disposed on the substrate including a plurality of light emitting diodes electrically connecting with the first conducting terminal and the second conducting terminal and emitting light during the positive half power cycle; a second light-emitting diode group disposed on the substrate including a plurality of light emitting diodes electrically connecting with the first conducting terminal and the second conducting terminal and emitting light during the negative half power cycle; a third light-emitting diode group disposed on the substrate including at least one light emitting diode electrically connecting with the first conducting terminal and the second conducting terminal and emitting light during the positive half power cycle and the negative half power cycle; wherein at least one light emitting diode in the first light-emitting diode group includes more than three conductive connecting points to electrically connect to at least the second light-emitting diode group and the third light-emitting diode group.

A light emitting diode device in accordance with another embodiment of the disclosure, the aforementioned at least one light emitting diode including more than three conductive connecting points includes four conductive connecting points.

A light emitting diode device in accordance with another embodiment of the disclosure further includes the same number of conductive bridges as the number of the conductive connecting points in the light emitting diode including more than three conductive connecting points aforementioned, directly connecting with the conductive connecting points aforementioned respectively, wherein one end of at least one of the aforementioned conductive connecting points directly connects with one conductive structure outside of the light emitting diode device.

A light emitting diode device in accordance with another embodiment of the disclosure further includes the same number of conductive bridges as the number of the conductive connecting points in the light emitting diode including more than three conductive connecting points aforementioned, directly connecting with the conductive connecting points aforementioned respectively, wherein one end of at least one of the aforementioned conductive connecting points directly connects with one light emitting diode in the third light-emitting diode group.

A light emitting diode device assembly is provided in accordance with another embodiment of the disclosure, including a plurality of the light emitting diode devices aforementioned disposed on the same substrate.

A light emitting diode device assembly in accordance with another embodiment of the disclosure, wherein the substrate includes at least three sides, and among the plurality of the light emitting diode devices, at least half of the third light-emitting diode groups in the light emitting devices located near the sides of the substrate.

A rectifying unit is provided in accordance with another embodiment of the disclosure, including a substrate; a first conducting terminal and a second conducting terminal receiving the alternative current signal; a first light-emitting diode group disposed on the substrate including a plurality of light emitting diodes electrically connecting with the first conducting terminal and the second conducting terminal and emitting light during the positive half power cycle or the negative half power cycle; a second light-emitting diode group disposed on the substrate including a plurality of light emitting diodes electrically connecting with the first conducting terminal and the second conducting terminal and emitting light during the positive half power cycle and the negative half power cycle; wherein the first light-emitting diode group includes at least one light emitting diode not adjacent to any light emitting diode in the second light-emitting diode group.

A rectifying unit in accordance with another embodiment of the disclosure includes one light emitting diode including more than three conductive connecting points.

DETAILED DESCRIPTION OF PREFERRED EMBODIMENTS

Figure 2:
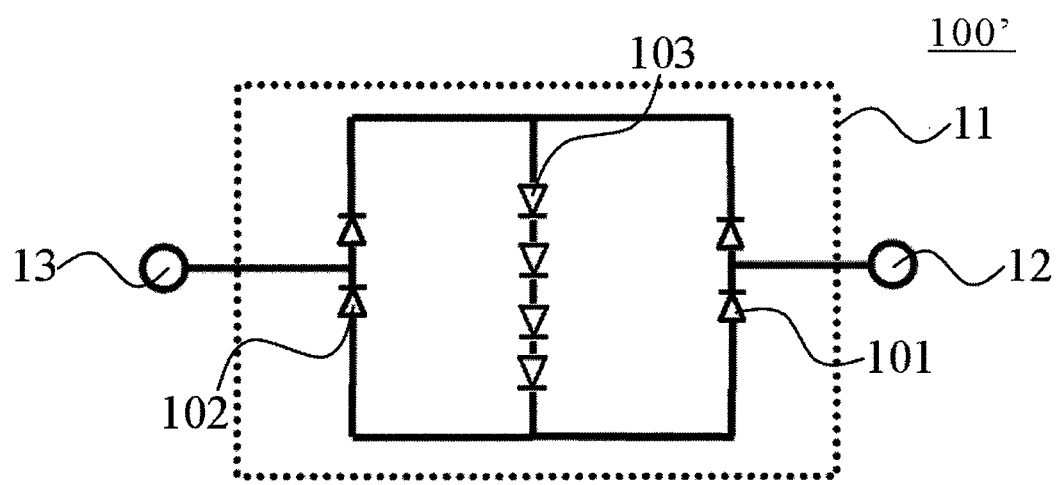
FIG. 2 illustrates an electrical circuit design in accordance with the light emitting diode device shown in FIG. 1.
Figure 3:
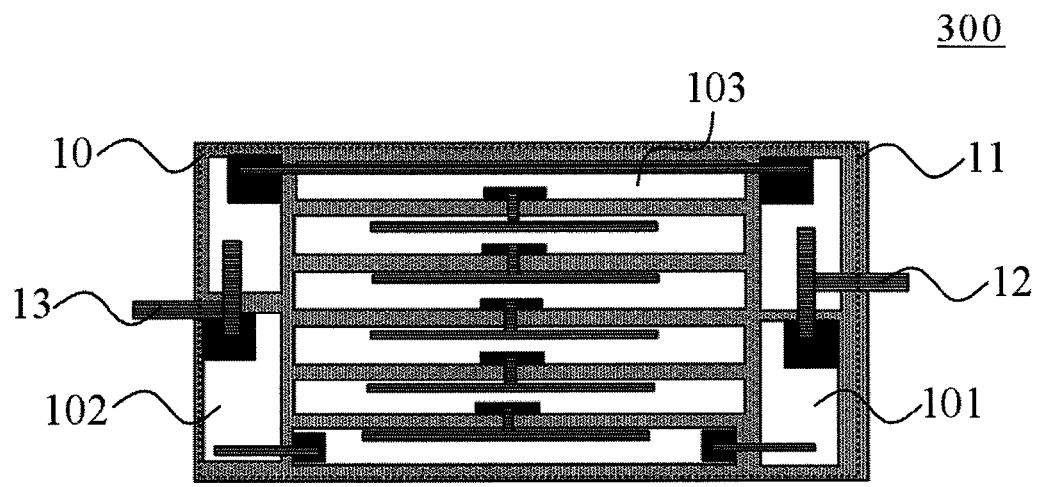
FIG. 3 illustrates another conventional structure of a light emitting diode device.
Figure 4:
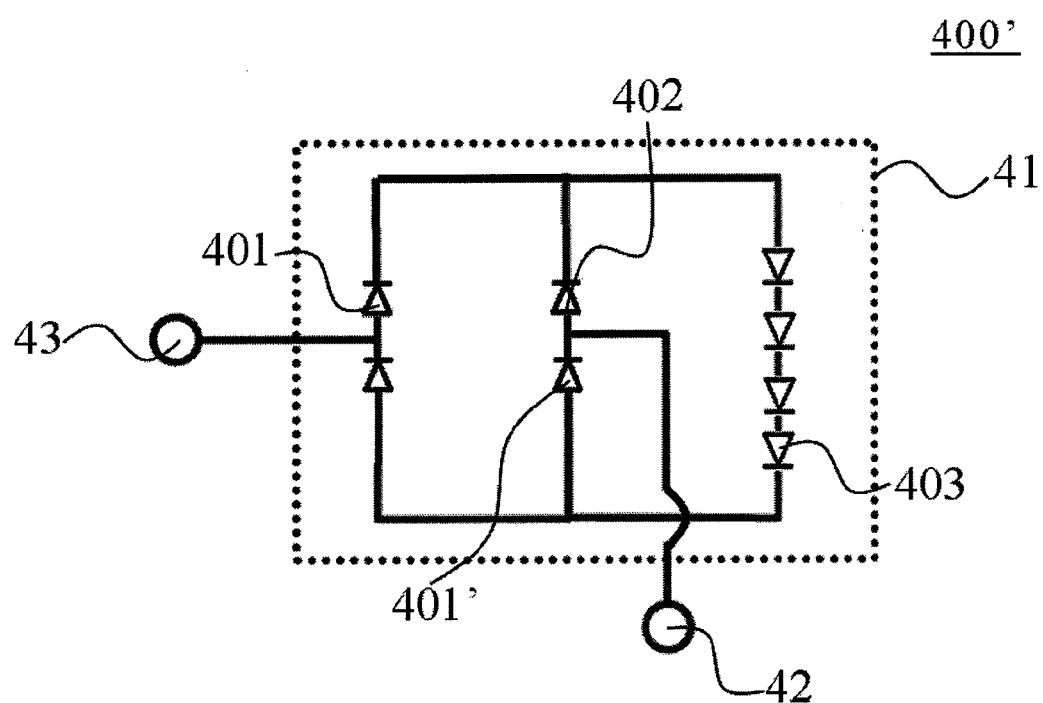
FIG. 4 illustrates an electrical circuit design in accordance with an embodiment of the disclosure.
Figure 5:
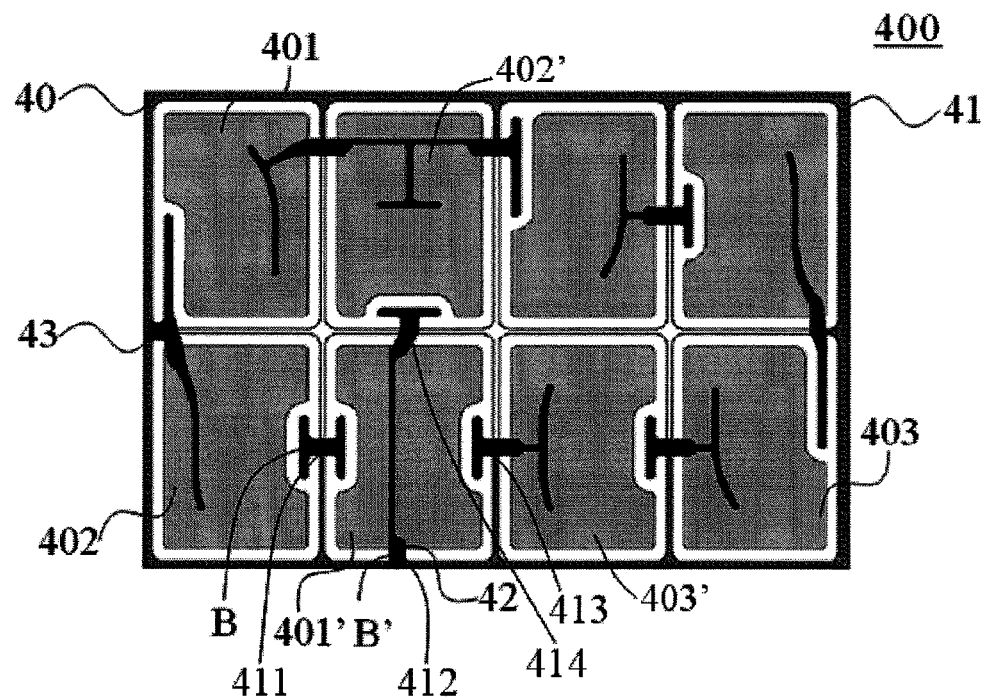
FIG. 5 illustrates a structure of a light emitting diode device in accordance with an embodiment of the disclosure.

Referring to FIG. 4 and FIG. 5, FIG. 4 shows an electrical circuit design 400' in accordance with an embodiment of the present disclosure, and FIG. 5 shows a structure of the light emitting diode device 400 in accordance with the electrical circuit design 400'. Considering the electrical circuit only, FIG. 2 and FIG. 4 are equivalent. However, take the device structures into consider, they are different. The structure of the light emitting diode device 400 is described in detail in the following sections.

The light emitting diode device 400 includes a substrate 40, a rectifying unit 41 formed on the substrate 40, a first conducting terminal 42 and a second conducting terminal 43 receiving the external power signals respectively. Wherein, the rectifying unit 41 includes a plurality of light-emitting diode groups 401, 402, and 403 arranged in accordance with the Wheatstone Bridge structure and electrically connecting between the first conducing terminal 42 and the second conducting terminal 43. When the alternative current signal is inputted form the external power, in accordance with the circuit design, the first light-emitting diode group 401 emits light during the positive half power cycle; the second light-emitting diode group 402 emits light during the negative half power cycle; and the third light-emitting diode group 403 emits light during both the positive half power cycle and the negative half power cycle.

In the light emitting diode device 400 in accordance with the present embodiment, the first light-emitting diode group 401 and the second light-emitting diode group 402 located at the same side of the full time emitting third light-emitting diode group 403. In order to electrically connect with the full time emitting third light-emitting diode group 403 and the external power at the same time, a light emitting diode 401' with four conductive connecting points is designed in the first light-emitting diode group 401 and the second light-emitting diode group 402 which are located at the same side. However, the number of the conductive connecting point is not limited to four. As shown in FIG. 5, the first and the second light-emitting diode groups 401, 402 and the third light-emitting diode group 403 are located at two sides of the substrate 40, respectively. In the first and the second light-emitting diode groups 401, 402, there is a light emitting diode 401' including four conductive connecting points 411, 412, 413, 414. In accordance with the present embodiment, the four conductive connecting points (411, 412. 413, 414) electrically connect to the first light-emitting diode group 401, the second light-emitting diode group 402, the third light-emitting diode group 403, and the external conductive structure which is outside of the rectifying unit 41, respectively.

In the present embodiment, the conductive connecting points 411, 412, 413, and 414 electrically connect to other light emitting diode structure through a conductive structure, respectively. The conductive structure is preferred to be a conductive bridge B formed by a conductor. In the light-emitting diode 401', four conductive connecting points 411, 412, 413, and 414 directly connect with four conductive bridges, respectively. Wherein, one end of each of the three conductive bridges B connects to three conductive connecting points 411, 413, 414, respectively. The other end of each of the three conductive bridges connects to three other light emitting diodes 402', 402", 403', respectively. Besides, the fourth conductive connecting point 412 directly connects to an external conductive bridge B' in one end, the other end of the fourth conductive connecting point connects to the external conductive structure outside of the light emitting diode device (not shown in the figure). Through the external conductive bridge, the light emitting diode device can electrically connect to other light emitting diode devices belonging to the different rectifying units located on the same or different substrate in series or in parallel, or directly connect to the power source or the device outside of the rectifying unit 41 for electrical conduction.

Next, forming a first light-emitting diode group with the half time emitting light-emitting diode group (the first light-emitting diode group and the second light-emitting diode group) and a second light-emitting diode group with the full time emitting light-emitting diode group (the third light-emitting diode group). Taking FIG. 5 as an example, in a single rectifying unit 41, the four half time emitting light emitting diodes 401, 401', 402, and 402' in the first light-emitting diode group are not all adjacent to the full time emitting light emitting diode in the second light-emitting diode group. Wherein, the light emitting diodes 401' and 402' are located between the light emitting diodes 401 and 402" and the second light-emitting diode group. In other words, the full time emitting light emitting diodes and the half time emitting light emitting diodes in a rectifying unit are located at two sides of the rectifying unit, respectively.

Figure 6:
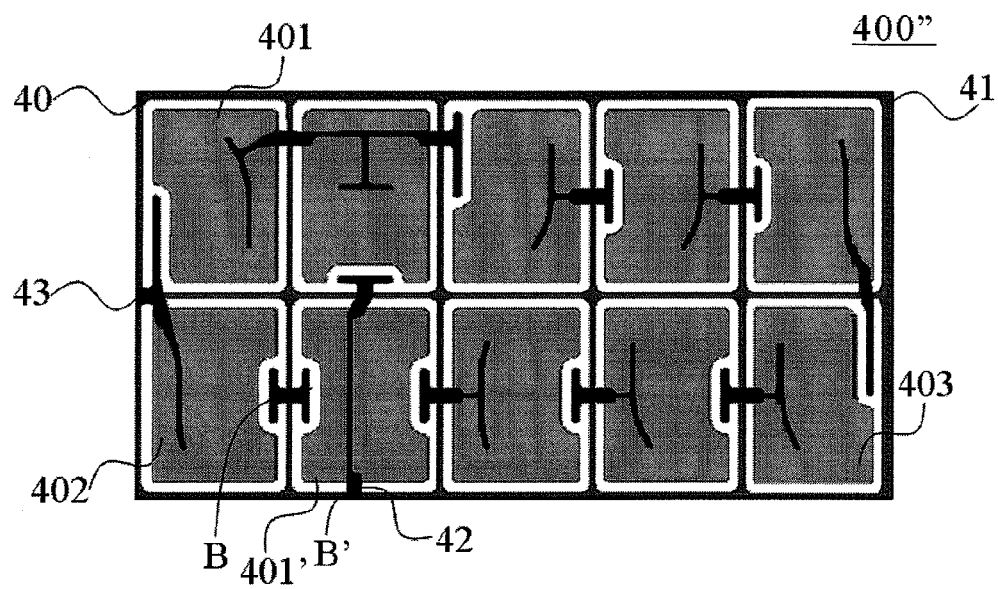
FIG. 6 illustrates another structure of a light emitting diode device in accordance with an embodiment of the disclosure.

Under the design principle of the light emitting diode device as shown in FIG. 5, when the number of the full time emitting light emitting diodes is increased, the rectifying light-emitting diode groups 401 and 402 located at one side of the light emitting diode device do not need to change correspondingly. As shown in FIG. 6, the structures of FIG. 6 and FIG. 5 are similar. FIG. 6 discloses another structure of the light emitting diode device 400" in accordance with another embodiment of the present application. Therefore, the same structure is numbered with the same number. Wherein, the number of the light emitting diodes in the full time emitting light-emitting diode group is added to six. As can be seen in this structure, the light emitting efficiency of the light emitting diode device can be enhanced easily by only adjusting the number of the full time light emitting diodes.

Figure 1:
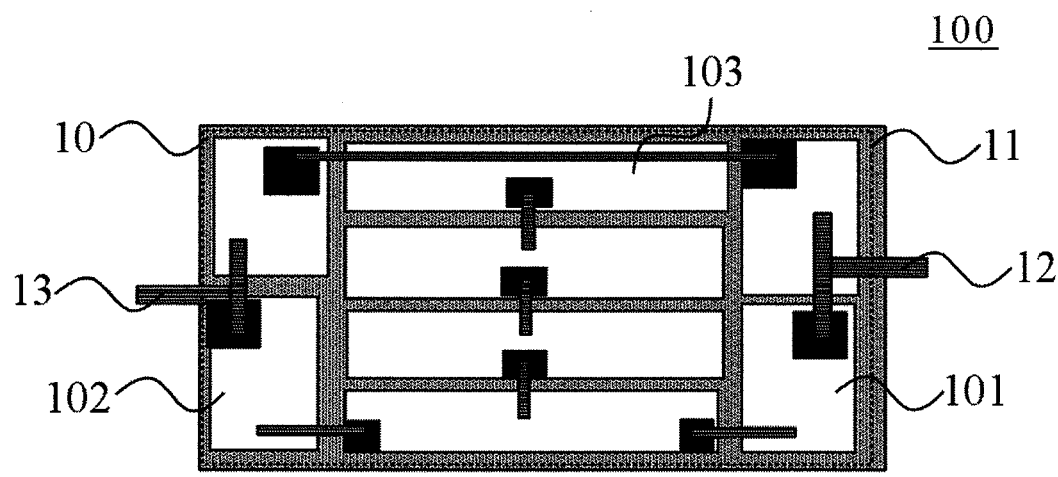
FIG. 1 illustrates a conventional structure of a light emitting diode device.
Figure 7:
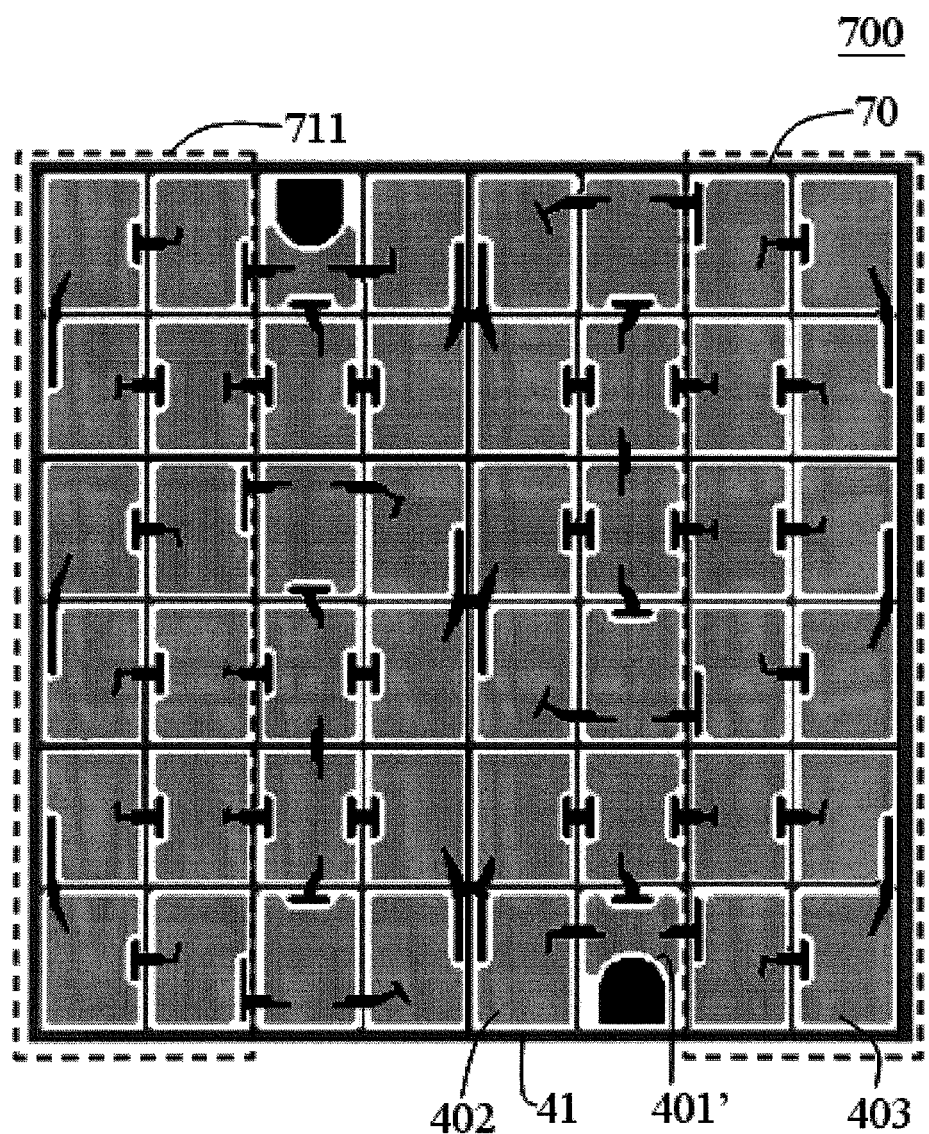
FIG. 7 illustrates a structure of a light emitting diode device assembly in accordance with an embodiment of the disclosure.

FIG. 7 discloses an assembly of a plurality of rectifying units 41 shown in FIG. 5. There are six rectifying units in FIG. 7, however, the number of the repeatable rectifying unit is not limit to six. Through the conductive connecting points connecting to the external conductive bridges located in the light emitting diodes 401' which includes four conductive connecting points in some rectifying units 41, the rectifying units 41 electrically connect to each other and form a larger light emitting diode assembly 700 on a single substrate 70. In every rectifying unit 41, the light emitting diodes can be classified into the full time emitting light emitting diodes and the half time emitting light emitting diodes in accordance with the period of the emitting time. Wherein, the first light-emitting diode group 401 and the second light-emitting diode group 402 belong to the half time emitting light emitting diodes. Accordingly, when external power source inputs the alternative current signal, the half time emitting light emitting diode emits light during the positive half power cycle or the negative half power cycle; the third light-emitting diode group 403 belongs to the full time emitting light emitting diodes, and when the external power source inputs the alternative current signal, the full time emitting light emitting diode emits light during both the positive half power cycle and the negative half power cycle. Because the emitting frequency of the full time emitting light emitting diodes is twice as the emitting frequency of the half time emitting light emitting diodes, more heat is produced in the full time emitting light emitting diodes. Compared with the conventional electrical circuit design (as shown in FIG. 1), the full time emitting light emitting diodes 403 can be located at one side of a single rectifying unit 41 as shown in FIG. 7. In the present embodiment, the light emitting diode assembly 700 includes a substrate 70, and when a plurality of light emitting diode devices is located on the substrate, all the full time emitting light emitting diodes in the light emitting diode devices are located at the periphery region 711 of the substrate 70 (the sides of the substrate 70). Through this design, the produced heat can be transmitted to outside fast and the heat dissipation efficiency of the device assembly can also be enhanced. Of course, in the design, for the consideration of the electrical connection, the better heat dissipation efficiency can be achieved as long as more than half of the full time emitting light emitting diodes are located at the sides of the substrate. The actual number of the light emitting diodes is not limited by the embodiments.

The light emitting diodes aforementioned in the embodiments can include the light emitting diodes emitting visible or invisible light, such as light emitting diodes emitting green light, yellow light, or UV light. The light emitting diodes can be AlGaInP based series and/or GaN based series light emitting diodes. Wherein, every light emitting diode further includes a first semiconductor layer with a first conductivity formed on the substrate, a second semiconductor layer with a second conductivity formed on the first semiconductor layer, and an active layer formed between the first semiconductor layer and the second semiconductor layer.

Based on the description above, the electrical circuit design, the light emitting diode device, and the light emitting diode device assembly in accordance with the present disclosure can preserve the size of the emitting area of each light emitting diode and raise the total brightness of the light emitting device at the same time. Besides, because the relative positions of the full time emitting light emitting diodes and the half time emitting light emitting diodes can be adjusted arbitrarily, good heat dissipation efficiency can also be achieved.

The embodiments mentioned above are used to describe the technical thinking and the characteristic of the invention and to make the person with ordinary skill in the art to realize the content of the invention and to practice, which could not be used to limit the claim scope of the present application. Any modification or variation according to the spirit of the present application should also be covered in the claim scope of the present disclosure.

What is claimed is:
1. A light emitting diode device, comprising:
   a substrate;
   a first conducting terminal and a second conducting terminal receiving an alternative current signal and on the substrate;
   a first light-emitting diode group disposed on the substrate, comprising a plurality of light emitting diodes, wherein the first light-emitting diode group electrically connects with the first conducting terminal and the second conducting terminal, and the first light-emitting diode group emits light during a one half power cycle of the alternative current signal;
   a second light-emitting diode group disposed on the substrate, comprising a plurality of light emitting diodes, wherein the second light-emitting diode group electrically connects with the first conducting terminal and the second conducting terminal, and the second light-emitting diode group emits light during the other half power cycle of the alternative current signal; and
   a third light-emitting diode group disposed on the substrate, comprising one light emitting diode, electrically connecting with the first conducting terminal and the second conducting terminal, and emitting light during the entire power cycle of the alternative signal;
wherein one light emitting diode in the first light-emitting diode group comprises four different conductive connecting points to electrically connect to two light emitting diodes in the second light-emitting diode group, the third light-emitting diode group, and one of a power source or another light emitting diode device respectively, and wherein two of the conductive connecting points are connected to each other by a connection across said light emitting diode in the first light-emitting diode group.

2. The light emitting diode device as claimed in claim 1, further comprises four conductive bridges directly connecting with the conductive connecting points respectively, wherein one end of at least one of the conductive connecting points directly connects with one conductive structure outside of the light emitting diode device or directly connects with one light emitting diode in the third light-emitting diode group.

3. The light emitting diode device as claimed in claim 1, wherein each light emitting diode comprises:
a first semiconductor layer formed on the substrate having a first type of conductivity;
a second semiconductor layer formed on the first semiconductor layer having a second type of conductivity; and
an active layer formed between the first semiconductor layer and the second semiconductor layer.

4. The light emitting diode device as claimed in claim 1, wherein the active layers in the light emitting diodes are composed of AlGaInP based series material and/or GaN based series material.

5. A light emitting diode device assembly comprises a single assembly substrate and a plurality of the light emitting diode devices as claimed in claim 1 formed thereon, wherein each light emitting diode device comprises the third light-emitting diode group.

6. The light emitting diode device assembly as claimed in claim 5, wherein the assembly substrate comprises three sides, and at least half of the third light-emitting diode groups are formed near the sides.

7. The light emitting diode device as claimed in claim 1, wherein two light emitting diodes in the first light-emitting diode group and two light emitting diodes in the second light-emitting diode group are staggered and adjacent to two light emitting diodes in the third light-emitting diode group.

8. The light emitting diode device as claimed in claim 1, wherein the one light emitting diode in the first light-emitting diode group physically connects to two light emitting diodes in the second light-emitting diode group and physically connects to one light emitting diode in the third light-emitting diode group.

9. The light emitting diode device as claimed in claim 1, wherein the third light-emitting diode group comprises four sides, wherein two light emitting diodes in the first light-emitting diode group and two light emitting diodes in the second light-emitting diode group are staggered and adjacent to one of the four sides of the third light-emitting diode group.

10. A rectifying unit comprising multiple corners, comprises:
a substrate;
a first conducting terminal and a second conducting terminal receiving an alternative current signal and on the substrate;
a first light emitting diode unit, disposed on the substrate, comprising a first light-emitting diode group and a second light-emitting diode group, wherein the first light-emitting diode group comprises a plurality of light emitting diodes, electrically connecting with the first conducting terminal and the second conducting terminal, and emitting light during one half power cycle, wherein the second light-emitting diode group comprises a plurality of light emitting diodes, electrically connecting with the first conducting terminal and the second conducting terminal, and emitting light during the other half power cycle of the alternative current signal; and
a second light emitting diode unit, disposed on the substrate, comprising a plurality of light emitting diodes, electrically connecting with the first conducting terminal and the second conducting terminal, and emitting light during the entire power cycle of the alternative current signal,
wherein one light emitting diode in the first light-emitting diode group or one light emitting diode in the second light-emitting diode group comprises four different conductive connecting points to electrically connect to two light emitting diodes in the other light-emitting diode group, the second light emitting diode unit, and one of a power source or another rectifying unit respectively, and the second light emitting diode unit is on the multiple corners of the rectifying unit.

11. The rectifying unit as claimed in claim 10, wherein each light emitting diode comprises:
a first semiconductor layer having a first conductivity formed on the substrate;
a second semiconductor layer having a second conductivity formed on the substrate; and
an active layer formed between the first semiconductor layer and the second semiconductor layer.

12. The rectifying unit as claimed in claim 10, wherein the active layers in the light emitting diodes are composed of AlGaInP based series material and/or GaN based series material.

13. The rectifying unit as claimed in claim 10, wherein one light emitting diode in the first light emitting diode group is not adjacent to any light emitting diode in the second light emitting diode group.

14. The rectifying unit as claimed in claim 10, wherein two light emitting diodes in the first light-emitting diode group and two light emitting diodes in the second light-emitting diode group are staggered and adjacent to two light emitting diodes in the third light-emitting diode group.

15. The rectifying unit as claimed in claim 10, wherein the one light emitting diode physically connects to two light emitting diodes in the second light-emitting diode group and physically connects to one light emitting diode in the third light-emitting diode group.

16. A rectifying unit, comprises:
a substrate;
a first conducting terminal and a second conducting terminal receiving an alternative current signal and on the substrate;
a first light emitting diode unit, disposed on the substrate, comprising a first light-emitting diode group and a second light-emitting diode group, wherein the first light-emitting diode group comprises a plurality of light emitting diodes, electrically connecting with the first conducting terminal and the second conducting terminal, and emitting light during one half power cycle, wherein the second light-emitting diode group comprises a plurality of light emitting diodes, electrically connecting with the first conducting terminal and the second conducting terminal, and emitting light during the other half power cycle of the alternative current signal; and a second light emitting diode unit, disposed on the substrate, comprising a plurality of light emitting diodes, electrically connecting with the first conducting terminal and the second conducting terminal, and emitting light during the entire power cycle of the alternative current signal, wherein one light emitting diode in the first light-emitting diode group or one light emitting diode in the second light-emitting diode group comprises four different conductive connecting points to electrically connect to two light emitting diodes in the other light-emitting diode group, the second light emitting diode unit, and one of a power source or another rectifying unit respectively, and the second light emitting diode unit comprises four sides, and wherein two light emitting diodes in the first light-emitting diode group and two light emitting diodes in the second light-emitting diode group are staggered and adjacent to one of the four sides of the second light emitting diode unit.

* * * * *